United States Patent [19]

Ward

[11] Patent Number: 4,482,591
[45] Date of Patent: Nov. 13, 1984

[54] POLYVINYL BUTYRATE PELLICLE COMPOSITIONS AND PELLICLES THEREOF FOR PROJECTION PRINTING

[75] Inventor: Irl E. Ward, Easton, Pa.

[73] Assignee: J. T. Baker Chemical Company, Phillipsburg, N.J.

[21] Appl. No.: 473,280

[22] Filed: Mar. 8, 1983

[51] Int. Cl.$^3$ .................................................. G02B 5/00
[52] U.S. Cl. ..................................... 428/66; 252/582; 350/315; 350/318; 355/53
[58] Field of Search .......................... 252/582; 355/53; 350/315, 318; 428/66

[56] References Cited

U.S. PATENT DOCUMENTS

| | | | |
|---|---|---|---|
| 3,474,039 | 10/1969 | Newing | 252/582 |
| 3,986,997 | 10/1976 | Clark | 528/32 |
| 4,131,363 | 12/1978 | Shea et al. | 355/53 |
| 4,320,940 | 3/1982 | Mueller et al. | 252/582 |

Primary Examiner—James C. Cannon
Attorney, Agent, or Firm—George W. Rauchfuss, Jr.

[57] ABSTRACT

A pellicle for use in projection printing comprises a pellicle in which the transparent film is formed from a polyvinyl butyral resin or from a casting composition which is a mixture of a polyvinyl butyral resin and a dispersion of colloidal silica and a silicone resin which is a lower aliphatic alcohol-water solution of the partial condensate of a silanol. A pellicle employing such films are useful in the near, mid and deep UV regions.

2 Claims, No Drawings

POLYVINYL BUTYRATE PELLICLE COMPOSITIONS AND PELLICLES THEREOF FOR PROJECTION PRINTING

FIELD OF THE INVENTION

This invention relates to pellicles for use in projection printing wherein said pellicles can be used in the deep UV region as well as the mid and near UV regions and to castable compositions for preparing films for use in said pellicles.

BACKGROUND OF THE INVENTION

In the field of projection printing and especially in the semiconductor industry and in the manufacture of integrated circuits the use of pellicles to shield a photomask from airborne particulate matter has gained increasing acceptance and use because of the multitude of benefits derived from their use. The employment of a pellicle for projection printing is described, for example, in U.S. Pat. No. 4,131,363, issued Dec. 26, 1978 to V. Shea et al. and assigned to International Business Machines Corp. The use of such pellicles in projecting printing has resulted in a reduction in mask and printing defects, increased mask reticle life, reduced aligner downtime, increased mask quality and increased device and reticle yield. Materials employed in the prior art and suitable for the production of films utilizable as pellicle films include polymer films of polyoxyethylene terephthalate, nitrocellulose and parylene.

The prior art polymer films while finding usefulness in projection printing systems as pellicle films have been severely limited in their usefulness. For example, while pellicles of such polymer films are useful in the near UV region (wavelengths 340–436 nm) and some usefulness in the mid UV region (wavelengths 280–340 nm) none has been acceptable for use in the deep UV region (wavelength 200–280 nm). Prior art pellicle films, while providing acceptable properties for use in the near and mid UV regions, have not provided acceptable light transmission properties in the deep UV region and thereby cannot be utilized in the deep UV region.

Furthermore, due to the advancing state of the art in this projection printing field in view of image geometries of less than 2 microns and device packing density approaching the VLSI and VHSI it is highly advantageous that projection imaging wavelength in the deep UV region be employed. Heretofore it has not been possible to enjoy the benefits derived from the use of pellicles in this deep UV region because of the unavailability of any pellicle acceptable for use in the deep UV region.

Additionally, although the prior art pellicle films have found usefulness in the near and mid UV regions, their performance has not been entirely satisfactory. Among the many factors detracting from their usefulness in these regions is the fact that their light transmission properties are not substantially 100 percent at the projection wavelengths but rather are generally 98% or less. Also, film tensile strength of the pellicle films has generally been in the range of 3,000–5,000 psi and the need for a film of increased tensile strength to increase the pellicle film life is desireable. Additionally, the percent of undesirable light scattering in said prior art pellicle films has generally been in the range of 0.3% at 365 nm. A film of decreased light scattering is highly desirable. Also with the prior art pellicle films, the percent etaloning, namely the difference between peak and minimum transmission, has only been as low as about 18% and it is of great advantage to reduce such etaloning as much as possible to increase the light transmission properties of the pellicles. Moreover, the prior art pellicle films, while desiring to obtain the best uniformity of film thickness so as to decrease exposure variations through the pellicle, have generally only obtained films with thickness variations of about 500 Å/cm. It is certainly preferred to obtain an otherwise acceptable film which has a much lower variation in film thickness. Prior art films have also suffered greatly from undesirable film defects such as haze, imbedded particles, pinholes, film gels, speckles, striations and other optical defects, which have adversely affected the overall performance of the pellicle films.

It is therefore highly desirable that a pellicle film be available which is useful in the deep UV region and which is as good or better in performance characteristics and/or physical properties as has been the case with pellicle films used in the mid or near UV regions. Moreover, it is also highly desirable that such pellicle film be useful in all three UV regions and that the performance characteristics and/or physical properties of such pellicle film in the mid and near UV regions be improved in whole or in part compared to the performance characteristics and/or physical properties of the materials heretofore employed in the prior art for pellicle films in the mid or near UV regions.

SUMMARY OF THE INVENTION

It has been discovered that a polyvinyl butyral polymer film is suitable for use as a pellicle film and that pellicles made therefrom can be used in projection printing in the near, mid and deep UV regions and have high light transmission properties as well as performance characteristics and/or physical properties as good as or better than pellicle films heretofore available which were usable only in the mid or near UV region. Additionally, a pellicle film cast from a novel castable solution of a mixture of a polyvinyl butyral and a dispersion of colloidal silica and a silicone resin which is a lower aliphatic alcohol-water solution of the partial condensate of a silanol produces a film with further improved light transmission properties in the deep UV region.

DETAILS OF THE INVENTION

A cast pellicle film suitable for use in the deep UV region as well as the near and mid UV regions and which possesses suitable light transmission properties in each of said UV regions as well as possessing suitable performance characteristics and/or physical properties is formed by casting a film of a polyvinyl butyral of the general formula

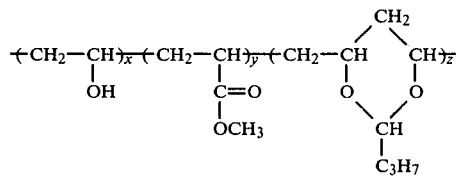

wherein X is $\leq 0.13$; y is $\leq 0.02$ and z is $\geq 0.88$. In said polyvinyl butyral the hydroxyl content of the polymer expressed as percent polyvinyl alcohol is equal to or less than 13%, generally from about 9 to 13%, the acetate content expressed as percent polyvinyl acetate is equal to 2.5% or less, generally from about 0 to 2.5%, and the butyral content expressed as percent polyvinyl butyral is at least about 88%. That is, while x, y and z are as defined above they preferably are defined as x is 0.09 to 0.13, y is 0.00 to 0.02 and z is equal to or greater than 0.88. A suitable polyvinyl butyral meeting said criteria is BUTVAR® B-79 polyvinyl butyral resin of the Monsanto Company of St. Louis, Mo., USA as described in their Technical Bulletin No. 6070D.

The dispersions of colloidal silica and a silicone resin which is a lower aliphatic alcohol-water solution of the partial condensate of a silanol suitable for use in this invention, are described in U.S. Pat. No. 3,986,997, issued Oct. 19, 1976 to Harold A. Clark and assigned to Dow Corning Corporation, which patent is incorporated herein by reference thereto. Such compositions comprise a dispersion of colloidal silica in lower aliphatic alcohol-water solution of the partial condensate of a silanol of the formula $RSi(OH)_3$ in which R is selected from the group consisting of alkyl radicals of 1 to 3 inclusive carbon atoms, the gammaglycidoxypropyl radical and the gamma-methacryloxypropyl radical, at least 70 weight percent of the silanol being $CH_3Si(OH)_3$ said composition containing 10 to 50 weight percent solids, said solids consisting essentially of 10 to 70 weight percent colloidal silica and 30 to 90 weight percent of the partial condensate, said composition containing sufficient acid to provide a pH in the range of 3.0 to 6.0.

The nonvolatile solids portion of the composition is a mixture of colloidal silica and the partial condensate of a silanol. The major portion of the partial condensate or siloxanol is obtained from the condensation of $CH_3Si(OH)_3$; a minor portion, if desired, being obtained from cocondensation with $C_2H_5Si(OH)_3$, $C_3H_7Si(OH)_3$,

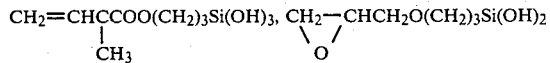

or mixtures thereof. From both the standpoint of economy and optimum properties in the cured coating it is preferred to utilize all monomethyltrisilanol in formulating the composition. The trisilanols are generated in situ by adding the corresponding trialkoxysilanes to acidic aqueous dispersions of colloidal silica. Suitable trialkoxysilanes are those containing methoxy, ethoxy, isopropoxy and t-butoxy substituents, which upon hydrolysis liberate the corresponding alcohol; thus generating at least a portion of the alcohol present in the composition. Upon generation of the silanol in the acidic aqueous medium, there is condensation of the hydroxyl substituents to form —Si—O—Si— bonding. The condensation is not complete, but rather the siloxane retains an appreciable quantity of silicon-bonded hydroxyl groups, thus rendering the polymer soluble in the water-alcohol solvent. This soluble partial condensate can be characterized as a siloxanol polymer having at least one silicon-bonded hydroxyl group per every three —SiO— units.

The silica component of the composition is present as colloidal silica. Aqueous colloidal silica dispersions generally have a particle size in the range of 5 to 150 nanometers in diameter. These silica dispersions are prepared by methods well-known in the art and are commercially available under such registered trademarks as "Ludox" and "Nalcoag". It is preferred to use colloidal silica of 10-30 nanometers particle size in order to obtain dispersions having a greater stability and having superior optical properties. Colloidal silicas of this type are relatively free of $Na_2O$ and other alkali metal oxides, generally containing less than 2 weight percent, preferably less than 1 weight percent $Na_2O$. They are available as both acidic and basic hydrosols. Colloidal silica is distinguished from other water dispersable forms of $SiO_2$, such as nonparticulate polysilicic acid or alkali metal silicate solutions, which are not operative in the practice of the present invention.

The silica is dispersed in a solution of the siloxanol carried in a lower aliphatic alcohol-water cosolvent. Suitable lower aliphatic alcohols include methanol, ethanol, isopropanol, and t-butyl alcohol. Mixtures of such alcohols can be used. Isopropanol is the preferred alcohol and when mixtures of alcohol are utilized, it is preferred to utilize at least 50 weight percent of isopropanol in the mixture to obtain optimum adhesion of the coating. The solvent system should contain from about 20 to 75 weight percent alcohol to ensure solubility of the siloxanol. Optionally one can utilize an additional water-miscible polar solvent, such as acetone, butyl cellosolve and the like in a minor amount, for example, no more than 20 weight percent of the cosolvent system.

To obtain optimum properties in the coating and to present immediate gellation of the composition, sufficient acid to provide a pH of from 3.0 to 6.0 must be present. Suitable acids include both organic and inorganic acids such as hydrochloric, acetic, chloroacetic, citric, benzoic, dimethylmalonic, formic, glutaric, glycolic, maleic, malonic, toluene-sulfonic, oxalic and the like. The specific acid utilized has a direct effect on the rate of silanol condensation which in turn determines shelf life of the composition. The stronger acids, such as hydrochloric and toluenesulfonic acid, give appreciably shortened shelf or bath life and require less ageing to obtain the described soluble partial condensate. It is preferred to add sufficient water-miscible carboxylic acid selected from the group consisting of acetic, formic, propionic and maleic acids to provide pH in the range of 4 to 5.5 in the coating composition. In addition to providing good bath life, the alkali metal salts of these acids are soluble, thus allowing the use of these acids with silicas containing a substantial (greater than 2.0% $Na_2O$)amount of alkali metal or metal oxide.

The coating compositions are easily prepared by adding trialkoxysilanes, such as $RSi(OCH_2)_3$, to colloidal silica hydrosols and adjusting the pH to the desired level by addition of the organic acid. The acid can be added to either of the silane or the hydroxol prior to mixing the two components provided that the mixing is done rapidly. The amount of acid necessary to obtain the desired pH will depend on the alkali metal content of the silica but is usually less than one weight percent of the composition. Alcohol is generated by hydrolysis of the alkoxy substituents of the silane, for example, hydrolysis of one mole of $Si(OC_2H_5)_3$ generates 3 moles of ethanol. Depending upon the percent solids desired in the final composition, additional alcohol, water or a water-miscible solvent can be added. The composition should be well mixed and allowed to age for a short period of time to ensure formation of the partial condensate.

Preferably the major portion of the partial condensate or siloxanol is obtained from the condensation of $CH_2Si(OH)_3$; a minor portion being obtained preferably from co-condensation with $C_2H_5Si(OH)_3$, $C_3H_7Si(OH)_3$

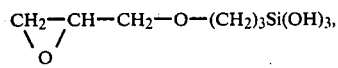

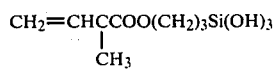

or mixtures thereof.

Examples of such a dispersion are the Dow Corning® ARC abrasion resistant coatings Q9-6312 and Q9-6313, which are more particularly described in Dow Corning Corporation's Technical Bulletin "Information About Silicone Coatings" (1981).

The castable solutions of the polyvinyl butyral mixed with the dispersion of colloidal silica in lower aliphatic alcohol-water solution of the partial condensate of a silanol useful in this invention comprise solutions wherein there is from about 10 to about 50%, preferably 10–30% and most preferably about 15%, dispersion solids based on the weight of polyvinyl butyral solids.

A film is cast on a wafer surface from the castible solution, the film is formed and cured, removed from the wafer and mounted between pellicle mounting rings to form a pellicle according to this invention. The film of the pellicle will generally be from about 0.5 to about 4 micron thick although films above and below this range are also possible.

The invention is illustrated by reference to the following examples which are merely illustrative and not limiting of this invention.

EXAMPLE 1

A castible solution is prepared at room temperature of polyvinyl butyral, BUTVAR® B-79, at 10% weight/weight solids in any suitable inert solvent casting system such as, for example, a 4/1 mixture of 2-ethoxyethanol/tetrahydrofurfuryl alcohol. To this solution is added 15% w/w based on the polyvinyl butyral solids, of a polysiloxane dispersion, Q9-6313, as a 35% solids solution in an alcohol/water solvent. The blended polymeric solutions are thoroughly mixed together to form a clear blend. Any undesired impurities are removed by filtering the solution successively through #1, #42 Whatman filters and then through a 0.2 um LS Millipore filter to yield a particulate and gel free solution.

The castable solution is poured onto a flat polished substrate, such as a 5" clean-dry silicon wafer, such that the substrate is flooded with solution, approximately 10 to 20 ml, before spinning begins. The flooded substrate is then spun at 2000 to 5000 rpm, preferably 2500 rpm, for 30 to 120 seconds, preferably about 60 seconds, to form a uniform film having a thickness of from about 0.5 to 4.0 um. The resulting cast, uniform film is cured by removal of the volatile components of the cast film. Removal of the volatile solvent components can be by any suitable means, such as by standing at room temperature for 12 or more hours at 40% relative humidity or by heating in a convection oven at about 40° to 100° C., preferably about 60° C., for a period of from about 30 to 240 minutes, preferably about 2 to 3 hours, followed by cooling to ambient temperature.

The cured film is then removed from the substrate. Removal can be, for example, by the following preferred method. The cured film is scored all around the wafer but in from the wafer edge (that is, in about 0.5 to 1.0 mm) using any suitable scoring instrument such as a razor knife. A round flexible ring, for example, a 5 ¾" diameter aluminum ring, having adhesive on one side is pressure attached to the periphery of the scored coated substrate. The film attached to the flexible ring is then peeled from the substrate under any suitable non-reactive inert fluid, such as water. The free film attached to the flexible ring is then evenly tensioned and attached sag free to a pellicle mounting ring by any suitable anchoring technique, such as, adhesive attachment to one side of a single pellicle mounting ring or by clamping the film between an interacting pair of pellicle mounting rings.

EXAMPLE 2

Following the procedure set forth in Example 1, a pellicle film is prepared from polyvinyl butyral. The castable solution is a solution of 10% weight/weight polyvinyl butyral, BUTVAR® B-79, in a 70–30 mixture of 2-ethoxyethanol and methyl ethyl ketone.

The pellicle films of this invention are useful in the deep UV region as well as the mid and near UV region. Additionally, the performance characteristics of the films of this invention in the near and mid UV regions are improved in numerous aspects. Moreover, the films of this invention are characterized by high light transmission properties.

For example, pellicle films of this invention possess essentially 100% light transmission over the near and mid UV regions whereas previously pellicle films produced at most only about 98% transmission. The pellicle films of this invention also possess high light transmission properties in the deep UV region, exhibiting 97% or more transmission at 240 nm and more than 90% transmission down to wavelength of about 226 nm. The films also possess the necessary tensile strength, namely about 8,000 to 10,000 psi. The light scattering of these films is only about 0.1% at 365 nm and the etaloning is in the range of 14 to 15% with the film of Example 2 and as low as 10–12% with the film of Example 1. Moreover, the films possess greatly improved film thickness uniformity showing less than 80Å/cm film thickness variation by phase measuring interferometry over a 4" diameter pellicle film. Additionally, the film are characterized by high film integrity, that is, being substantially free of haze, imbedded particles, pinholes, film gels, speckles, striatures or other optical defects. Also, the films can withstand from about 6,000 to 10,000 or more exposures in the deep UV region, namely at 240–270, nm, before degradation of the pellicle film due to the burning of an arc into the film. Moreover, the pellicle films of this invention can be cleaned of foreign particulate material by water cleaning, such as by water spraying or immersion in water for short periods of time, without adverse effects on the pellicle or any swelling of the pellicle film.

The addition of the dispersion of colloidal silica and a silicone resin, as described, to polyvinyl butyryal provides pellicle films of improved light transmission properties in the deep UV region at about 240 nm compared to films of polyvinyl butyral alone.

I claim:

1. A pellicle for use in projection printing comprising a cast polyvinyl butyral film mounted in a pellicle mounting ring and wherein the polyvinyl butyral has the formula
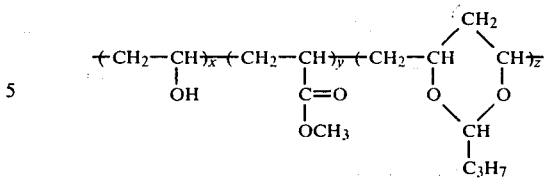
wherein x is $\leq 0.13$, y is $\leq 0.02$ and z is $\geq 0.88$.
2. A pellicle of claim 1 wherein x is about 0.09 to about 0.13, y is about 0.0 to about 0.02.
* * * * *